United States Patent [19]
Kamiya et al.

[11] Patent Number: 5,241,269
[45] Date of Patent: Aug. 31, 1993

[54] APPARATUS AND METHOD FOR MEASURING HYSTERESIS CHARACTERISTICS IN A HIGH FREQUENCY RANGE

[75] Inventors: Shigeo Kamiya, Kanagawa; Hideo Akama, Tokyo, both of Japan

[73] Assignee: Hewlett-Packard Company, Palo Alto, Calif.

[21] Appl. No.: 831,997

[22] Filed: Feb. 6, 1992

[30] Foreign Application Priority Data

Feb. 15, 1991 [JP] Japan .................................. 3-44234

[51] Int. Cl.⁵ .......................................... G01R 33/14
[52] U.S. Cl. .................................... 324/223; 324/626
[58] Field of Search ............... 324/222, 223, 626, 211, 324/239

[56] References Cited

U.S. PATENT DOCUMENTS

| | | | |
|---|---|---|---|
| 2,934,696 | 4/1960 | Williams et al. | 324/223 X |
| 3,238,449 | 3/1966 | Gordon et al. | 324/626 X |
| 4,044,302 | 8/1977 | Mayberry | 324/223 |
| 4,463,313 | 7/1984 | Steingroever et al. | 324/223 X |
| 4,573,012 | 2/1986 | Bisson et al. | 324/223 |
| 4,623,841 | 11/1986 | Stinson et al. | 324/223 |

OTHER PUBLICATIONS

Yoshifumi Sakurai, "Magneto-Ceramics", Ohm Company 1980, pp. 202–227.
M. Kido, "Know-hows for measuring high frequency characteristics of magnetic materials", pp. 300–311, Nikkei Electronics, No. 483, published Sep. 28, 1989.

Primary Examiner—Gerard R. Strecker
Assistant Examiner—Warren S. Edmonds

[57] ABSTRACT

Apparatus for measuring a hysteresis characteristic of magnetic material, dielectric material or the like in a high frequency range without using a high-speed A/D converter. A current having a predetermined frequency is applied to an object being examined 4 and the magnetic field and magnetic flux density in the object 4 are detected. The detection signals are successively subjected to frequency conversion with predetermined frequencies corresponding to a fundamental wave and harmonic waves by mixers 17, 18. The frequency-converted signals are input to bandpass filters 19, 20. The output signals of the bandpass filters, which are signals of an intermediate frequency, are converted to digital signals by A/D converters 25, 26, the apparatus thereby detecting the fundamental wave component and each higher harmonic component.

12 Claims, 4 Drawing Sheets

APPARATUS AND METHOD FOR MEASURING HYSTERESIS CHARACTERISTICS IN A HIGH FREQUENCY RANGE

FIELD OF THE INVENTION

This invention relates to apparatus and methods for measuring hysteresis characteristic of objects being examined, including objects composed of magnetic material, dielectric material or the like. The invention is more particularly related to apparatus for measuring hysteresis characteristics in a high frequency range.

BACKGROUND OF THE INVENTION

The measurement of a hysteresis characteristic of magnetic material is required in research and development of the magnetic material and magnetic parts that utilize the magnetic material (e.g., a transformer, a coil head, a magnetic recording medium and the like), quality controls for products, and process controls for manufacturing these elements. In addition, the measurement of the hysteresis characteristic of a magnetic material is also required in the design of products including magnetic parts, such as a power source, electrical circuit, VTR and so on.

A conventional apparatus for estimating the hysteresis characteristic of magnetic materials is disclosed by Yoshifumi Sakurai, "Magneto-Ceramics" pp 202–227, published 1980, by Ohm Company in Japan. In that apparatus a B-H characteristic of magnetic material is measured with an X-Y coil while vibrating the magnetic material. The magnetic material is evaluated using a D.C. magnetic field; therefore, if the magnetic material is to be used in a high frequency application, the hysteresis estimation for the magnetic material thus obtained will not represent a real or practical characteristic of the magnetic material. In addition, the apparatus requires an enormous yoke and thus its price is high.

A B-H analyzer for measuring a hysteresis characteristic of a magnetic material in a high frequency range is disclosed in "Nikkei Electronics" pp 300–311, published on Oct. 2, 1989 by Nikkei Business Publications Inc. in Japan. In that apparatus a magnetic material is magnetized by a high-frequency current flowing through a primary coil and a magnetic field H and a magnetic flux density B are estimated on the basis of the high-frequency current and an induced voltage produced across a secondary coil. However, this type of analyzer requires an expensive high-speed A/D converter and has the further disadvantage of a frequency band restricted to 10 Mhz or less. Generally, however, the magnetic field H and the magnetic flux density B include high-frequency components, which in this scheme are not detected. Thus, in this analyzer the actual hysteresis characteristic of the magnetic material cannot be accurately estimated.

SUMMARY OF THE INVENTION

Accordingly, the object of the present invention is to overcome the above disadvantages and provide a hysteresis characteristic measuring apparatus capable of accurately estimating a hysteresis characteristic of a device under test (DUT) in a high frequency range without a high-speed analog to digital (A/D) converter. DUT's include magnetic materials and dielectric materials with hysteresis.

Apparatus in accordance with the present invention comprise first signal source means for generating a first signal of a predetermined frequency and so applying the first signal to an object being examined as to generate a magnetic field and magnetic flux in the object being examined, first detection means for generating a second signal proportional to said magnetic field, second detection means for generating a third signal proportional to the magnetic flux density in said object being examined, second signal source means for generating a plurality of signals each having a predetermined frequency in accordance with a fundamental wave and respective higher harmonics to be detected, first and second mixer means for successively converting respective output signals of said first and second detection means to signals each having a difference frequency between output frequencies of said first and second signal source means, first and second bandpass filter means for passing therethrough only an intermediate frequency component of respective output signals of said first and second mixer means, first and second A/D converter means for converting respective output signals of said first and second bandpass filter means to corresponding digital signals, and computing means for computing parameters indicative of hysteresis characteristics of said object being examined.

One preferred embodiment of the invention further comprises 0°/90° detector means for separating the output signals of the first and second bandpass filter means into respective sine components and cosine components and outputting the respective sine and cosine components to the first and second A/D converter means.

In addition, the first detection means may include a toroidal coil having a primary current that is an output current of the first signal source means.

Another embodiment of the invention is adapted to measure a hysteresis characteristic of an object comprising dielectric material. In this embodiment the first signal is applied to the dielectric material, the first detection means generates a signal proportional to a current flowing through the dielectric material and the second detection means generates a signal proportional to a voltage produced across the dielectric material.

The present invention also encompasses apparatus comprising first signal source means for generating a first signal of a first predetermined frequency ($f_S$) and by applying the first signal to an object being examined generating an electromagnetic field and flux in the object being examined, first detection means for generating a second signal proportional to the electromagnetic field, second detection means for generating a third signal proportional to the flux density in the object being examined, second signal source means for generating a plurality of signals having frequencies ($f_S+f_{IF}$, $2f_S+f_{IF}$, ..., $nf_S+f_{IF}$) determined on the basis of the first predetermined frequency $f_S$, higher harmonics to be detected and a predetermined intermediate frequency $f_{IF}$, first and second mixer means for converting respective output signals of the first and second detection means to intermediate signals each having an intermediate frequency (IF) component, first and second A/D converter means for digitizing the said IF components, and computing means for computing parameters indicative of hysteresis characteristics of the object being examined.

Methods encompassed by the present invention comprise the steps of generating a first signal of a predetermined frequency and applying the first signal to an object being examined so as to generate an electromagnetic field and flux in the object being examined, generating a second signal proportional to the electromagnetic field, generating a third signal proportional to the flux density in the object being examined, converting the second and third signals to intermediate signals each having an IF component, digitizing the IF components, and computing, on the basis of digitized IF components, parameters indicative of a hysteresis characteristic of the object.

In preferred embodiments of the invention, a measuring signal having a predetermined frequency $f_s$ which is generated by a first signal source is applied to a DUT composed of a magnetic material, a first detection means comprising, e.g., a current detecting resistor, generates a signal proportional to the magnetic field in the magnetic material, and a second detection means generates a signal proportional to the magnetic flux density in the magnetic material.

A second signal source successively outputs a signal having a frequency $f_{LO}=f_S+f_{IF}$, which corresponds to the fundamental wave, and signals having frequencies $f_{LO}=2f_S+f_{IF}, 3f_S+f_{IF}, \ldots, nf_S+f_{IF}$, which correspond to the respective higher harmonic waves. First and second mixers successively convert the respective outputs of the first and second detection means to signals having frequencies $f_{LO}-f_S, f_{LO}-2f_S, f_{LO}-3f_S, \ldots, f_{LO}-nf_s$ (i.e., signals having an intermediate frequency component). First and second bandpass filters pass the respective intermediate frequency components of the output signals of the first and second mixers, and first and second A/D converters convert the respective output signals of the first and second bandpass filters to corresponding digital signals. By successively changing the frequency $f_{LO}$ of the output signal of the second signal source to one of the frequencies $f_S+f_{IF}, 2f_S+f_{IF}, 3f_S+f_{IF}, \ldots, nf_S+f_{IF}$, respective components of the magnetic field and the magnetic flux density in the magnetic material (such as respective fundamental wave components, respective secondary harmonic components, respective tertiary harmonic components, . . . , respective n-th harmonic components) can be detected.

Further, a hysteresis characteristic of the magnetic material which is measured in consideration of each phase of the harmonic waves is obtainable by separating the output signals of the bandpass filters into the sine components and the cosine components through the 0°/90° detectors. In addition, a hysteresis characteristic which can follow the sharp rise-up of a B-H curve is measurable using a transformer, such as a 1:n winding ratio toroidal coil, as the magnetic field detector.

In the hysteresis measuring apparatus as described above, if a current applied to a dielectric material and a voltage induced across the dielectric material are detected by the first detection means and the second detection means, respectively then a hysteresis characteristic of the dielectric substance can be measured.

DETAILED DESCRIPTION OF PREFERRED EMBODIMENTS

Figure 1:
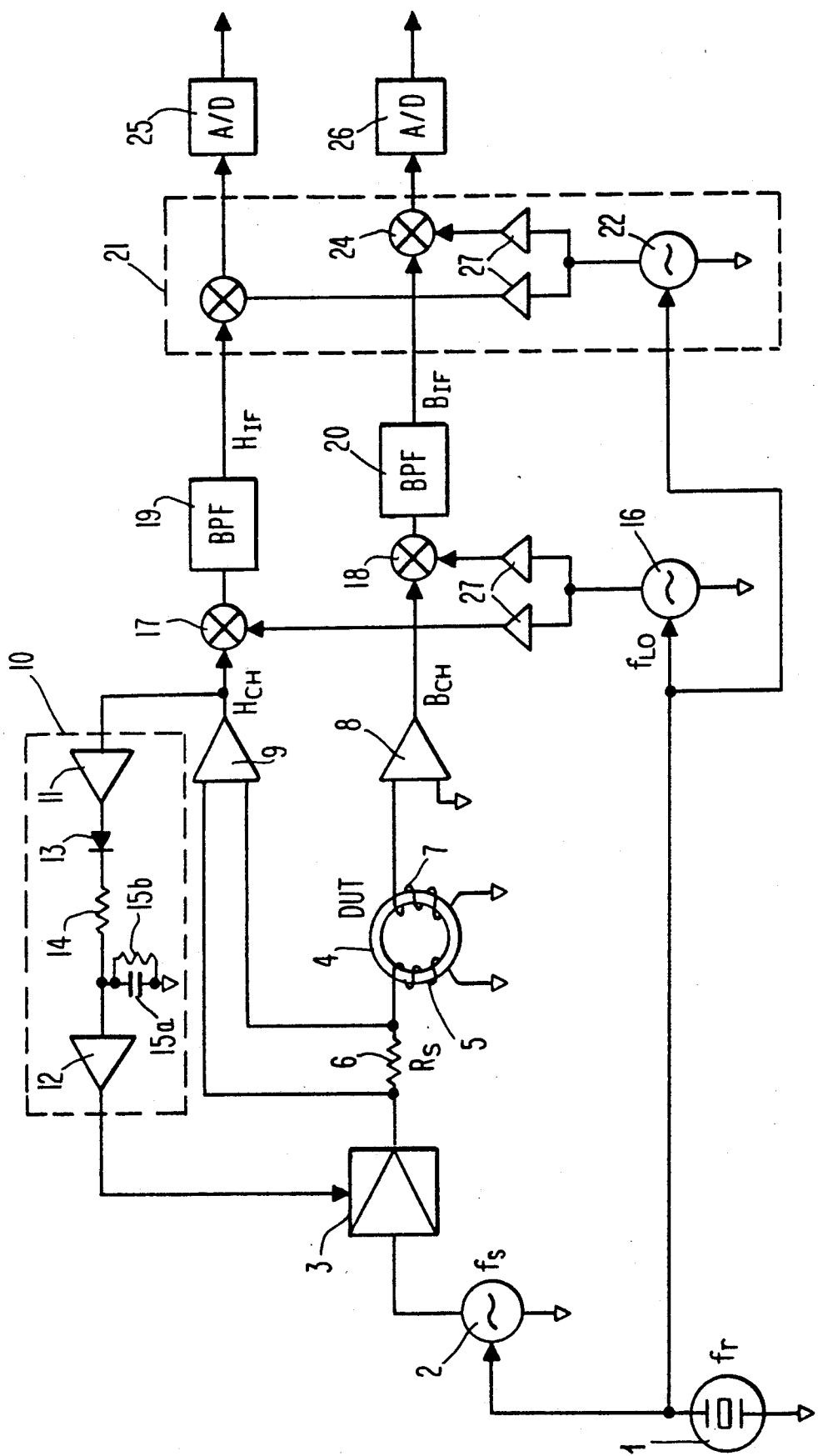
FIG. 1 is a schematic diagram of one embodiment of a hysteresis characteristic measuring apparatus in accordance with the present invention.

An embodiment of this invention will now be described with reference to FIG. 1. A signal having a frequency $f_r$ which is generated in an oscillator 1 is input to a first signal source 2, and then the first signal source 2 generates a stabilized signal of frequency $f_S$, which is obtained by dividing the output frequency $f_r$ of the oscillator 1 using a phase locked loop (PLL) circuit. The output signal of the signal source 2 is amplified by an amplifier 3, and then input to a magnetic material, represented by DUT 4 in FIG. 1. The DUT 4 is wound by a magnetic field-applying coil 5 and magnetized with a high frequency current which is output by the amplifier 3. In order to detect this magnetizing current, a current detecting resistor 6 is interposed between the amplifier 3 and the magnetic field-applying coil 5. A voltage between the terminals of the current detecting resistor 6 is input to an amplifier 9 and thereby amplified, and then output to a next stage as a signal $H_{CH}$ proportional to the magnetic field in the DUT 4.

The DUT 4 is also wound by a magnetic flux-detecting coil 7 as well as the magnetic field-applying coil 5, and magnetic flux density in the DUT 4 is measured by detecting a voltage induced between the terminals of the coil 7. The induced voltage of the magnetic flux-detecting coil 7 is input to an amplifier 8 and thereby amplified, and then is output as a signal $B_{CH}$ proportional to the magnetic flux density in the DUT 4.

The signal $H_{CH}$ is fed back through a peak value detecting circuit 10 to the amplifier 3. The peak value detecting circuit 10 comprises amplifiers 11 and 12, a diode 13, a resistor 14, a parallel combination of a capacitor 15a and a resistor 15b, and serves to detect a peak value of the signal $H_{CH}$ and then feed back the signal $H_{CH}$ to the amplifier 3. The amplifier 3 is controlled by this feedback signal to output a current having a constant peak value. The peak value detecting circuit 10 is not necessarily indispensable for this embodiment, and may be eliminated if a current having a stabilized peak value is obtainable.

The oscillating signal of the oscillator 1 is also input to a second signal source 16, and the second signal source 16 generates a stabilized signal of frequency $f_{LO}$ through a dividing operation of the output frequency $f_r$ of the oscillator 1 using a PLL control.

The signal of the signal source 16 is input through respective buffers 27 to first and second mixers 17 and 18. Both the output signal $H_{CH}$ of the amplifier 9 and the signal transmitted from the signal source 16 through the buffer 27 are synthesized by the mixer 17, while both the output signal $B_{CH}$ of the amplifier 8 and the output signal transmitted from the signal source 16 through the buffer 27 are synthesized by the mixer 18, thereby subjecting the signals $H_{CH}$ and $B_{CH}$ to a frequency conversion operation.

Thereafter, the frequency-converted signals output by the mixers 17, 18 are input to bandpass filters 19, 20, which only pass the component of intermediate frequency $f_{IF}$. The relationship between the frequency $f_{IF}$ and the frequencies $f_S$ and $f_{LO}$ is represented by the following equation:

$$f_{IF} = f_{LO} - f_S \qquad (1)$$

The signals from the bandpass filters 19 and 20 are inputs to a 0°/90° detector 21. The detector 21 comprises a signal source 22 and mixers 23, 24. The signal source 22 outputs a signal of intermediate frequency $f_{IF}$ having phases of, for example, 0°, 90°, 180° and 270° by dividing the output frequency $f_r$ of the oscillator 1 or by performing the PLL control operation therefor.

The output signal $H_{IF}$ of the bandpass filter 19 and the signal transmitted from the signal source 22 through the buffer 27 are mixed by the mixer 23, while the output signal $B_{IF}$ of the bandpass filter 20 and the signal transmitted from the signal source 22 through the buffer 27 are mixed by the mixer 24, and the respective composite signals from the mixers 23, 24 are input to A/D converters 25 and 26, respectively.

Operation of the hysteresis characteristic measuring apparatus thus constructed will now be described.

First, an operation in a case where the output frequency $f_S$ of the signal source 2 is fixed will be described. The output signals $B_{CH}$ and $H_{CH}$ of the amplifiers 8 and 9 include higher harmonic waves as described above, and the frequency of the fundamental wave for these harmonic waves is the frequency $f_S$. It is assumed that the output frequency $f_{LO}$ of the signal source 16 is set to a frequency which satisfies the following equation:

$$f_{LO} = f_S + f_{IF} \qquad (2)$$

The frequency $f_{IF}$ of the output signal of the bandpass filters 19, 20 is represented by the equation (1), and thus the output signals $H_{IF}$ and $B_{IF}$ of the bandpass filters 19, 20 correspond to the respective fundamental wave components of the signals $H_{CH}$ and $B_{CH}$.

Next, the output frequency $f_{LO}$ of the signal source 16 is successively changed to each of the frequencies shown in the following Table 1, the apparatus thereby successively detecting frequency components of $2f_S$, $3f_S$, ..., $nf_S$, i.e., the components from the secondary harmonic wave component to n-th harmonic wave component as the output signals $H_{IF}$ and $B_{IF}$ of the bandpass filters 19, 20.

TABLE I

| $f_{LO}$ | Components detected |
|---|---|
| $f_s + f_{IF}$ | fundamental component ($f_s$) |
| $2f_s + f_{IF}$ | 2nd harmonic component ($2f_s$) |
| $3f_s + f_{IF}$ | 3rd harmonic component ($3f_s$) |
| ... | ... |
| $nf_s + f_{IF}$ | n-th harmonic component ($nf_s$) |

Figure 2:
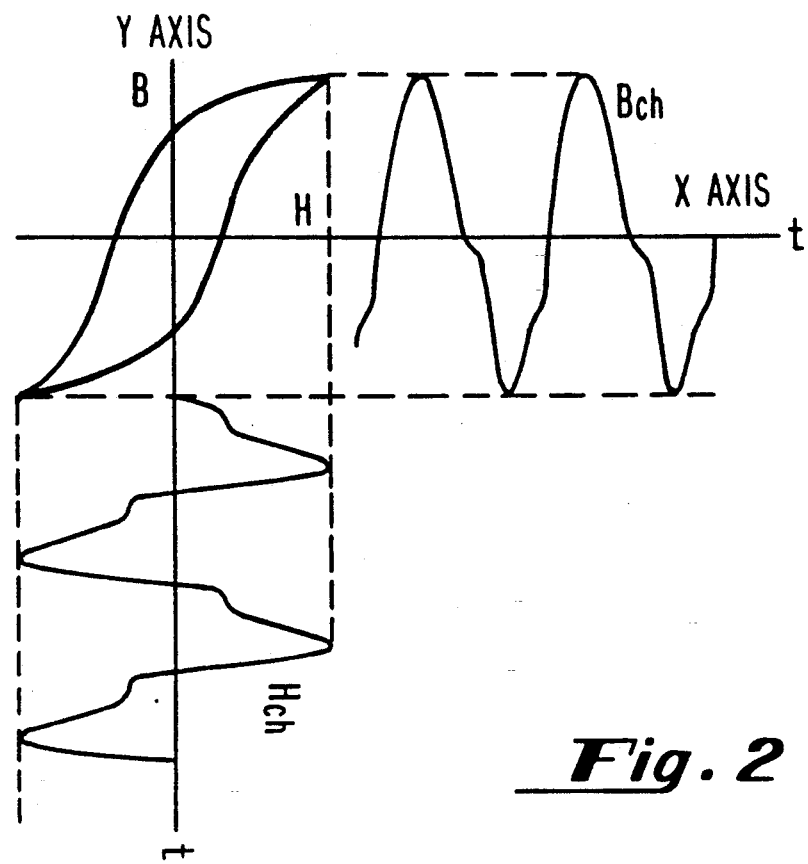
FIG. 2 depicts exemplary B and H waveforms and a corresponding B-H curve.

In the manner described above, the fundamental wave components and the higher harmonic components of the signals $H_{CH}$ and $B_{CH}$ are obtained, and these components are subjected to A/D conversion by the first and second A/D converters 25, 26 to thereby obtain a frequency spectra. The frequency spectra is subjected to an Inverse Fast Fourier Transformation (Inverse FFT), so that respective waveforms of $B_{CH}$ and $H_{CH}$ are obtained in the time domain, as shown in FIG. 2. These waveforms are plotted in two dimensions with $H_{CH}$ and $B_{CH}$ to obtain a B-H curve as shown in FIG. 2. If the output frequency $f_S$ of the signal source 2 is set to 1 MHz, for example, the B-H curve thus obtained will be a B-H curve for 1 MHz.

In addition, a mutual relationship between amplitudes and phases of harmonic components of the output signals $H_{IF}$ and $B_{IF}$ of the bandpass filters 19 and 20 are kept unchanged. Accordingly, a more accurate B-H curve may be obtained by separating each higher harmonic component into a sine component and a cosine component by the 0°/90° detector 21 and then subjecting each sine and cosine component to Inverse Fast Fourier Transformation. In this case, if the output frequency $f_S$ of the signal source 2 were swept to any frequency, then a frequency characteristic of the B-H curve would be obtained. Although the B-H curve rounds remarkably as the frequency $f_S$ exceeds 100 MHz, a substantially accurate B-H curve can be obtained if the primary to approximately tenth-order harmonic components are detected. In this case, the output frequency of the signal source 16 may be set to approximately 2 GHz.

Further, if attention is paid to the material or shape of a jig or the like for supporting the DUT 4, the frequency $f_S$ can be increased approximately to 500 MHz. The present invention imposes no restriction on the frequency, so that the frequency $f_S$ can be increased to a higher frequency if the problem of the jig and so on are overcome. Still further, if the magnetic field to be applied to the DUT 4 is increased by the amplifier 3, a B-H curve for any region between linear and saturation regions can be obtained.

The hysteresis characteristic of the DUT 4 can be estimated by obtaining the magnetic permeability ($\mu = dB/dH$), coercive force, rectangular ratio, hysteresis loss, etc. of the DUT 4. Accordingly, a material having a suitable characteristic can be developed and thus an electrical part which is optimal to the characteristic of a magnetic part can be designed, so that quality can be wholly improved over various industrial fields from magnetic materials to applied equipment.

It should be noted that, since the signals to be input to the A/D converters 25, 26 have a low frequency $f_{IF}$ at all times, the hysteresis characteristic of the DUT 4 in the high frequency range can be obtained without using high-speed A/D converters.

In the above embodiment, the output signals $H_{IF}$ and $B_{IF}$ of the bandpass filters 19, 20 are separated into sine components and cosine components by the 0°/90° detector 21 and then subjected to A/D conversion. However, the signals $H_{IF}$ and $B_{IF}$ may alternatively be directly subjected to A/D conversion without passing through the 0°/90° detector 21 to analyze the hysteresis characteristic of the DUT 4.

Figure 3:
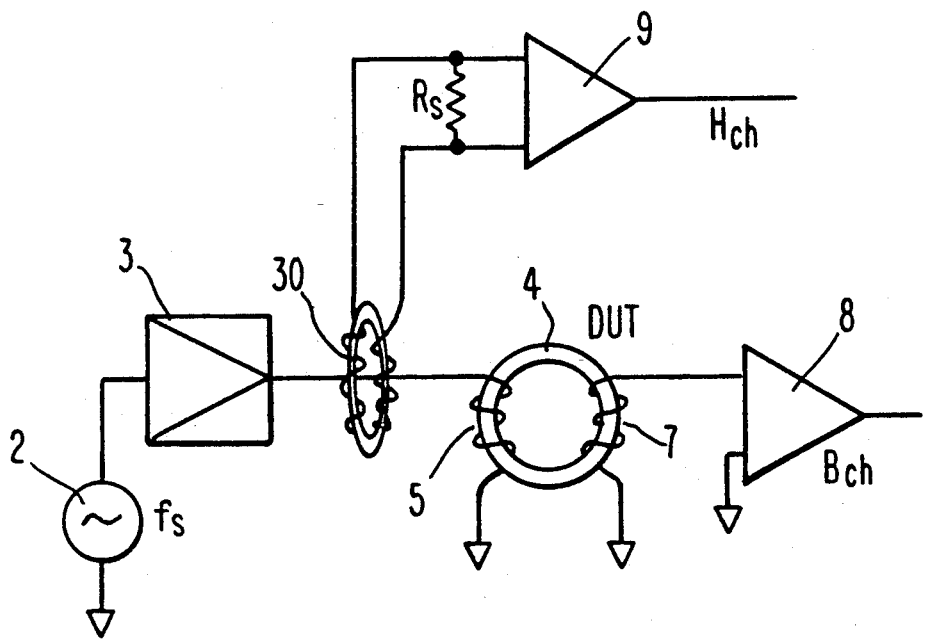
FIG. 3 is a partial schematic diagram of another embodiment of the present invention in which a current-detecting toroidal coil is used.
Figure 4:
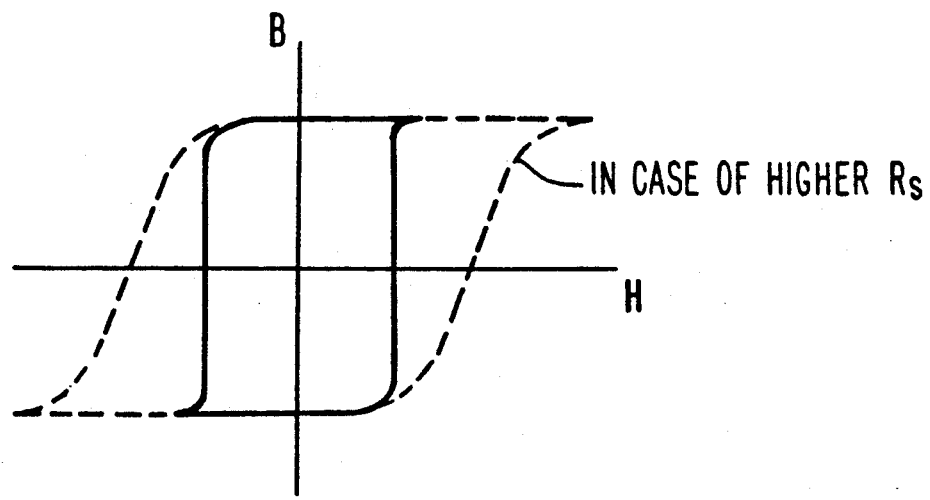
FIG. 4 is a graph showing the variation of a B-H curve with the resistance value of a current detecting resistor.

Further, as shown in FIG. 3, a toroid coil of one turn, that is, a 1:n winding ratio toroidal coil 30 may be disposed between the amplifier 3 and the DUT 4, and a current detecting resistor $R_S$ may be further disposed at the secondary side of the toroidal coil 30. In this case, the equivalent resistance at the primary side of the toroidal coil 30 is represented by $R_S/n$. Therefore, it is possible to reduce the driving impedance of the magnetic field-applying coil 5, i.e., the output impedance of the amplifier 3, and thus the sharp rise-up of the B-H curve can be followed. As shown in FIG. 4, a B-H curve represented by the dotted line is obtained for a large value of $R_S$, while a B-H curve represented by the solid line is obtained for a small $R_S$.

Figure 6:
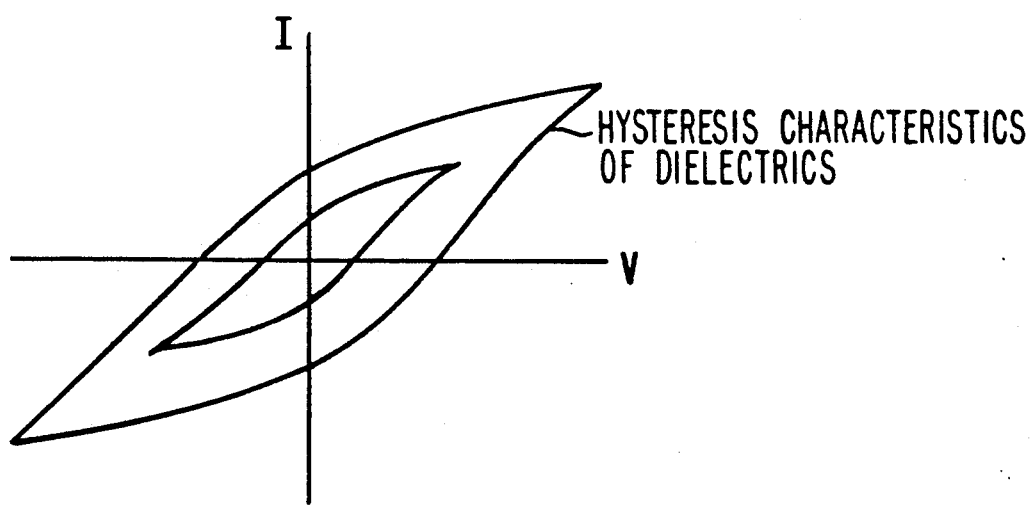
FIG. 6 is a graph showing an exemplary hysteresis characteristic of a dielectric substance.
Figure 5:
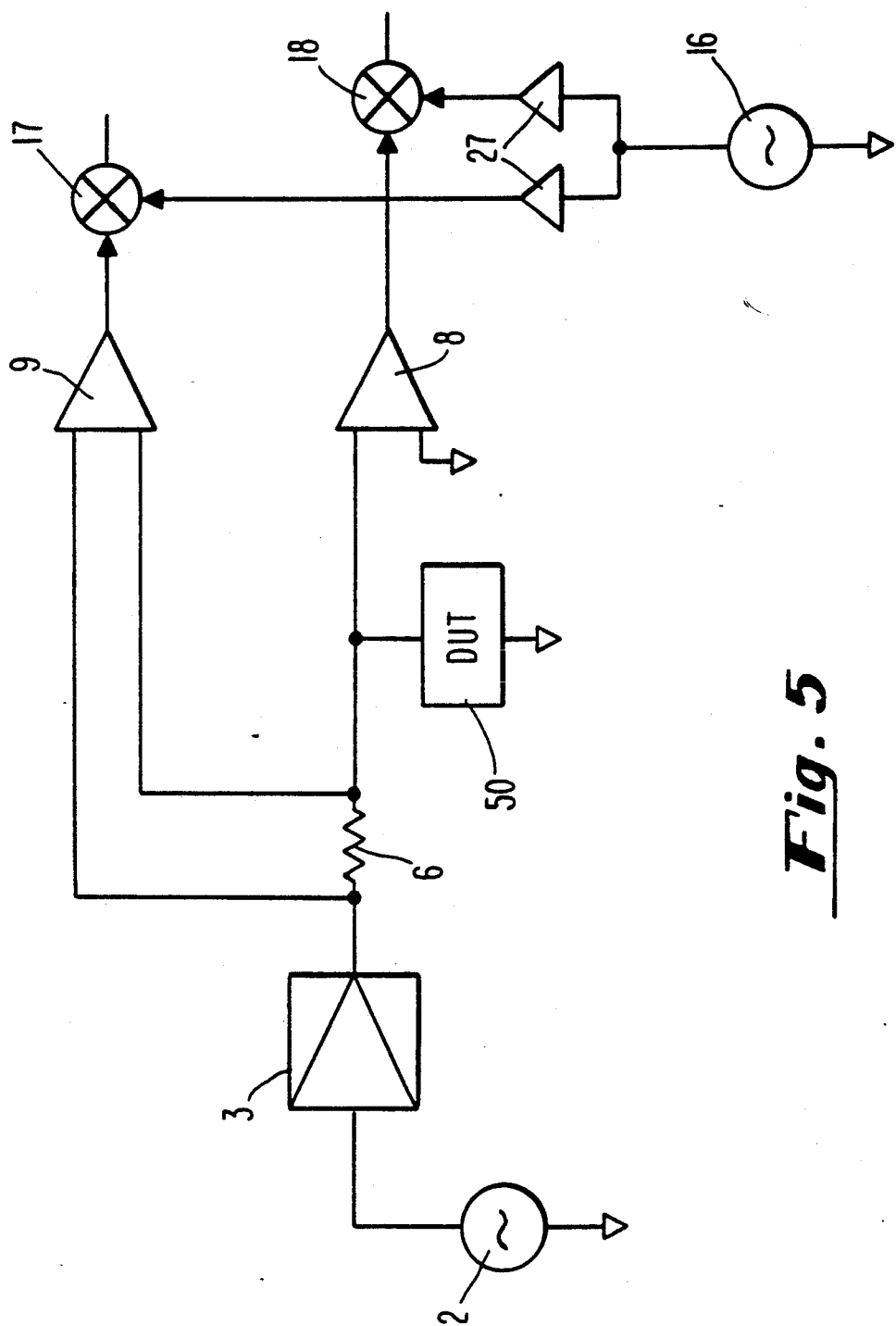
FIG. 5 is a partial schematic diagram of another embodiment of the invention, which is applied to measurements of hysteresis characteristics of dielectric substances.

In the embodiment described above, a magnetic material is used as the DUT and hysteresis characteristic measuring apparatus are described. However, the present invention is applicable to various kinds of analysis for nonlinear materials, such as ceramic materials. FIG. 5 shows another embodiment of the invention, which is substantially similar to that of FIG. 1; however instead of the magnetic DUT 4 a ceramic element 50 is connected to the input terminal of the amplifier 8. Representing outputs of the amplifiers 8 and 9 by $V_{CH}$ and $I_{CH}$, an I-V curve as shown in FIG. 6 may be obtained. The dielectric constant $e = dI/dV$ of the ceramic element 50 also has a hysteresis characteristic, and thus the hysteresis characteristic of the ceramic dielectric material can be measured.

Further, a C-V characteristic (capacity characteristic) of a semiconductor element in an inverse-biasing operation also has a nonlinearity, and it is required to intensify a signal level to a maximum value at which the nonlinearity is developed in order to improve a signal-to-noise ratio. This requirement is also satisfied by obtaining the optimal signal level using an embodiment of this invention.

As is apparent from the embodiments of FIGS. 1 and 5, the present invention is applicable to hysteresis characteristic measuring apparatus for magnetic materials and dielectric materials by replacing a DUT part of an RF impedance analyzer with a magnetic material 4 or ceramic element 50, or by replacing $V_{CH}$ and $I_{CH}$ of an impedance analyzer with $B_{CH}$ and $H_{CH}$. Therefore, the invention may be applicable as an optional unit for an impedance analyzer.

Although preferred embodiments of the invention are described in detail in this specification, many variations of those embodiments are encompassed by invention as defined by the following claims.

What is claimed is:

1. An apparatus for measuring a hysteresis characteristic of an object, comprising:
   first signal source means for generating a first signal of a predetermined frequency and so applying said first signal to an object being examined as to generate a magnetic field and magnetic flux in the object being examined;
   first detection means for generating a second signal proportional to said magnetic field;
   second detection means for generating a third signal proportional to the magnetic flux density in said object being examined;
   second signal source means for generating a plurality of signals each having a predetermined frequency in accordance with a fundamental wave and respective higher harmonics to be detected;
   first and second mixer means for successively converting respective output signals of said first and second detection means to signals each having a difference frequency between output frequencies of said first and second signal source means;
   first and second bandpass filter means for passing therethrough only an intermediate frequency component of respective output signals of said first and second mixer means; and
   first and second analog to digital (A/D) converter means for converting respective output signals of said first and second bandpass filter means to corresponding digital signals;
   whereby a hysteresis characteristic of said object being examined is computable on the basis of said digital signals.

2. The apparatus recited in claim 1, further comprising 0°/90° detector means for separating the output signals of said first and second bandpass filter means into respective sine components and cosine components and outputting the respective sine and cosine components to said first and second A/D converter means.

3. The apparatus recited in claim 1, wherein said first detection means includes a toroidal coil having a primary current that is an output current of said first signal source means.

4. The apparatus recited in claim 2, wherein said first detection means includes a toroidal coil having a primary current that is an output current of said first signal source means.

5. The apparatus recited in claim 1 adapted to measure a hysteresis characteristic of an object comprising dielectric material, wherein said first signal is applied to the dielectric material, said first detection means generates a signal proportional to a current flowing through the dielectric material and said second detection means generates a signal proportional to a voltage produced across the dielectric material.

6. An apparatus for measuring a hysteresis characteristic of an object, comprising:
   first signal source means for generating a first signal of a first predetermined frequency ($f_S$) and by applying said first signal to an object being examined generating an electromagnetic field and flux in the object being examined;
   first detection means for generating a second signal proportional to said electromagnetic field;
   second detection means for generating a third signal proportional to the flux density in said object being examined;
   second signal source means for generating a plurality of signals having frequencies ($f_S + f_{IF}$, $2f_S + f_{IF}$, ... , $nf_S + f_{IF}$) determined on the basis of said first predetermined frequency $f_S$, higher harmonics to be detected and a predetermined intermediate frequency $f_{IF}$;
   first and second mixer means for converting respective output signals of said first and second detection means to intermediate signals each having an intermediate frequency (IF) component; and
   first and second analog to digital (A/D) converter means for digitizing said IF components;
   whereby a hysteresis characteristic of said object being examined is computable on the basis of digital signals from the A/D converter means.

7. The apparatus recited in claim 6, further comprising 0°/90° detector means for separating said IF components into respective sine components and cosine components and outputting the respective sine and cosine components to said first and second A/D converter means.

8. The apparatus recited in claim 6, wherein said first detection means includes a toroidal coil having a primary current that is an output current of said first signal source means.

9. The apparatus recited in claim 7, wherein said first detection means includes a toroidal coil having a primary current that is an output current of said first signal source means.

10. The apparatus recited in claim 6 adapted to measure a hysteresis characteristic of an object comprising dielectric material, wherein said first signal is applied to the dielectric material, said first detection means generates a signal proportional to a current flowing through the dielectric material and said second detection means generates a signal proportional to a voltage produced across the dielectric material.

11. A method for measuring a hysteresis characteristic of an object, comprising the steps of:

generating a first signal of a predetermined frequency and applying said first signal to an object being examined so as to generate an electromagnetic field and flux in the object being examined;

generating a second signal proportional to said electromagnetic field;

generating a third signal proportional to the flux density in said object being examined;

converting said second and third signals to intermediate signals each having an intermediate frequency (IF) component;

digitizing said IF components; and computing, on the basis of digitized IF components, parameters indicative of a hysteresis characteristic of said object.

12. The method recited in claim 11, further comprising the step of, prior to digitizing said IF components, separating said IF components into respective sine components and cosine components.

* * * * *